United States Patent
Van De Graaff

(10) Patent No.: US 6,628,561 B2
(45) Date of Patent: Sep. 30, 2003

(54) SMALL ANTI-FUSE CIRCUIT TO FACILITATE PARALLEL FUSE BLOWING

(75) Inventor: Scott Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,602

(22) Filed: Aug. 30, 2001

(65) Prior Publication Data

US 2003/0043676 A1 Mar. 6, 2003

(51) Int. Cl.[7] .................................................. G11C 7/00
(52) U.S. Cl. ................. 365/225.7; 365/96; 365/189.05; 327/525; 327/526
(58) Field of Search ............................... 365/225.7, 96, 365/189.05; 327/525, 526, 54

(56) References Cited

U.S. PATENT DOCUMENTS

| | | | |
|---|---|---|---|
| 5,294,846 A | | 3/1994 | Paivinen |
| 5,706,238 A | * | 1/1998 | Cutter et al. .............. 365/225.7 |
| 5,838,625 A | | 11/1998 | Cutter et al. |
| 5,892,716 A | * | 4/1999 | Ingalls ................... 365/189.05 |
| 5,945,840 A | * | 8/1999 | Cowles et al. ................. 326/38 |
| 6,128,241 A | | 10/2000 | Choi |
| 6,133,778 A | * | 10/2000 | Kim et al. ................... 327/525 |
| 6,144,247 A | * | 11/2000 | Kim et al. ................... 327/525 |

* cited by examiner

Primary Examiner—Hoai Ho
Assistant Examiner—Gene N. Auduong
(74) Attorney, Agent, or Firm—Dickstein Shapiro Morin & Oshinsky LLP

(57) ABSTRACT

An apparatus and associated method are provided to improve the programming of anti-fuse devices in an integrated circuit. A programming circuit capable of programming a plurality of anti-fuse devices in parallel permits a state-changing voltage to be applied to multiple anti-fuses substantially simultaneously using a common control signal.

26 Claims, 5 Drawing Sheets

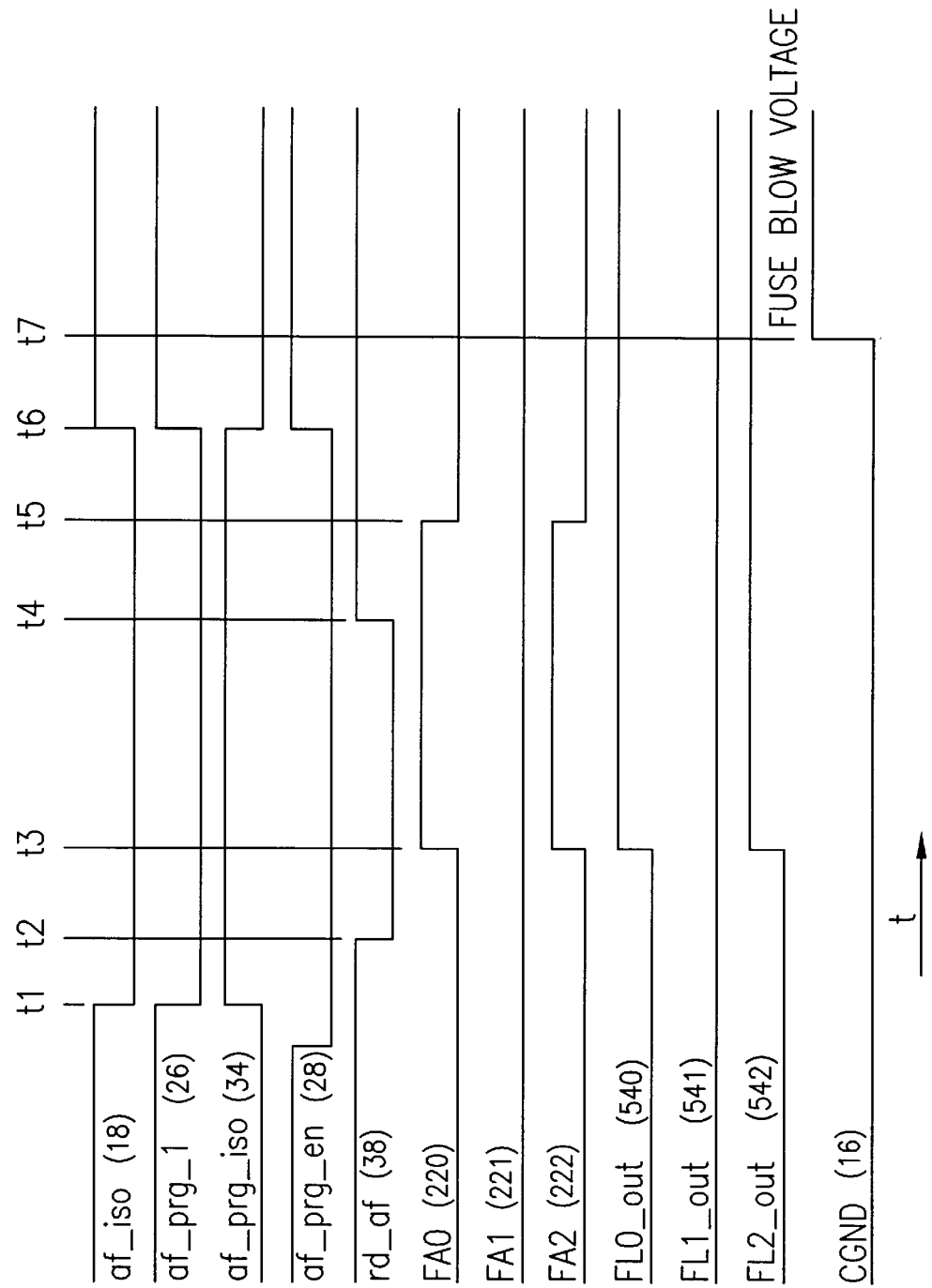

SMALL ANTI-FUSE CIRCUIT TO FACILITATE PARALLEL FUSE BLOWING

FIELD OF THE INVENTION

The present invention relates to blowing of anti-fuses in an integrated circuit, and more particularly, to a small anti-fuse circuit to facilitate parallel anti-fuse blowing.

BACKGROUND OF THE INVENTION

Semiconductor manufacturers are under increasing pressure to improve the capacity and performance of semiconductor devices. For example, memory devices having an increasing number of individual memory elements are in demand, as well as devices that function at increased operating rates.

One consequence of this pressure is that all semiconductor operations are under increased scrutiny to determine where performance improvements may be gained. Among the semiconductor operations scrutinized is the time required to program anti-fuse devices used to configure redundant circuit elements.

For example, it may be necessary to replace defective or otherwise undesired circuit elements in an integrated circuit. Modern integrated circuits are designed having multiple redundant circuit elements available to provide replacement circuit elements, the replacement circuit elements being separated from the active circuit by anti-fuse devices. One method of replacing circuit elements includes reconfiguring the circuit by blowing the separating anti-fuse devices. By blowing an anti-fuse device, a first circuit element may be activated to replace a second circuit element that may likewise be deactivated.

One example of redundant circuit elements is the common use in a memory device of redundant rows and/or columns of memory cells to replace one or more rows and/or columns of primary memory which contain defective cells.

Because each integrated circuit includes many circuit elements, and hence includes many redundant circuit elements, programming the anti-fuse devices can be a complex and time-consuming process. For instance, anti-fuse devices and the accompanying redundant circuit elements are typically configured such that the anti-fuse devices must be programmed individually in series. For integrated circuits having many anti-fuse devices to be programmed, the serial programming of anti-fuse devices may consume valuable time and resources. As integrated circuit devices increase in size, the time required to program the anti-fuse devices likewise increases significantly.

Accordingly, there is a strong desire and need to improve the performance of integrated circuits by providing a method of programming a plurality of anti-fuse devices substantially simultaneously.

BRIEF SUMMARY OF THE INVENTION

An apparatus and associated method are provided to facilitate the programming of anti-fuse devices in an integrated circuit. An anti-fuse programming circuit is described that is capable of programming a plurality of anti-fuse devices in parallel. This circuit permits multiple anti-fuses to be blown substantially simultaneously using one common programming signal.

The programming circuit of the invention includes a plurality of programmable elements and a plurality of programming circuits, each associated with a programmable element and each including a latch circuit for receiving and holding a desired programming state of an associated programmable element. The plurality of programming circuits set the states of the associated programmable elements in accordance with a desired programming state held in an associated latch circuit in response to a common control signal.

In another aspect of the invention, the programming circuit includes a latch circuit; a latch-programming circuit configured to temporarily apply a programming signal to an input of the latch circuit, the latch circuit latching a state of the programming signal; a signal line applying a voltage sufficient to change the state of the programmable element; a latch isolation transistor coupled between the programmable element and the latch circuit; a state control transistor coupled between the programmable element and a first reference voltage and having a gate controlled by an output of the latch circuit; wherein during a programming phase, the anti-fuse latch circuit is configured to latch the soft-programming signal, and during a common control phase, the latch isolation transistor is configured to decouple the programmable element from the latch circuit and the signal line is configured to apply the state-changing voltage to the programmable element if the output of the latch circuit turns on the state control transistor.

In another aspect of the invention, the invention provides a method of programming a plurality of programmable elements, including soft-programming a plurality of latches to a desired state, each latch associated with a respective programmable element, and hard-programming the plurality of programmable elements with the state of an associated latch using a common control signal.

In another aspect of the invention, the method of programming the anti-fuse includes providing a state control transistor coupled between the programmable element and a first reference voltage; providing a latch circuit having an input coupled to the programmable element through a latch isolation transistor and an output coupled to control a gate of the state control transistor; during a programming phase, applying a programming signal to the input of the latch circuit, and latching the programming signal in the latch circuit; during a common control phase, applying a voltage sufficient to change a state of the programmable element if an output of the latch circuit activates the state control transistor, and decoupling the programmable element from the latch circuit using the latch isolation transistor.

BRIEF DESCRIPTION OF THE DRAWINGS

These and other features of the invention will be more clearly understood from the following detailed description of the invention which is provided in conjunction with the accompanying drawings.

FIG. 3 illustrates exemplary timing diagrams for the circuit shown in FIG. 2.

DETAILED DESCRIPTION OF THE INVENTION

Figure 1:
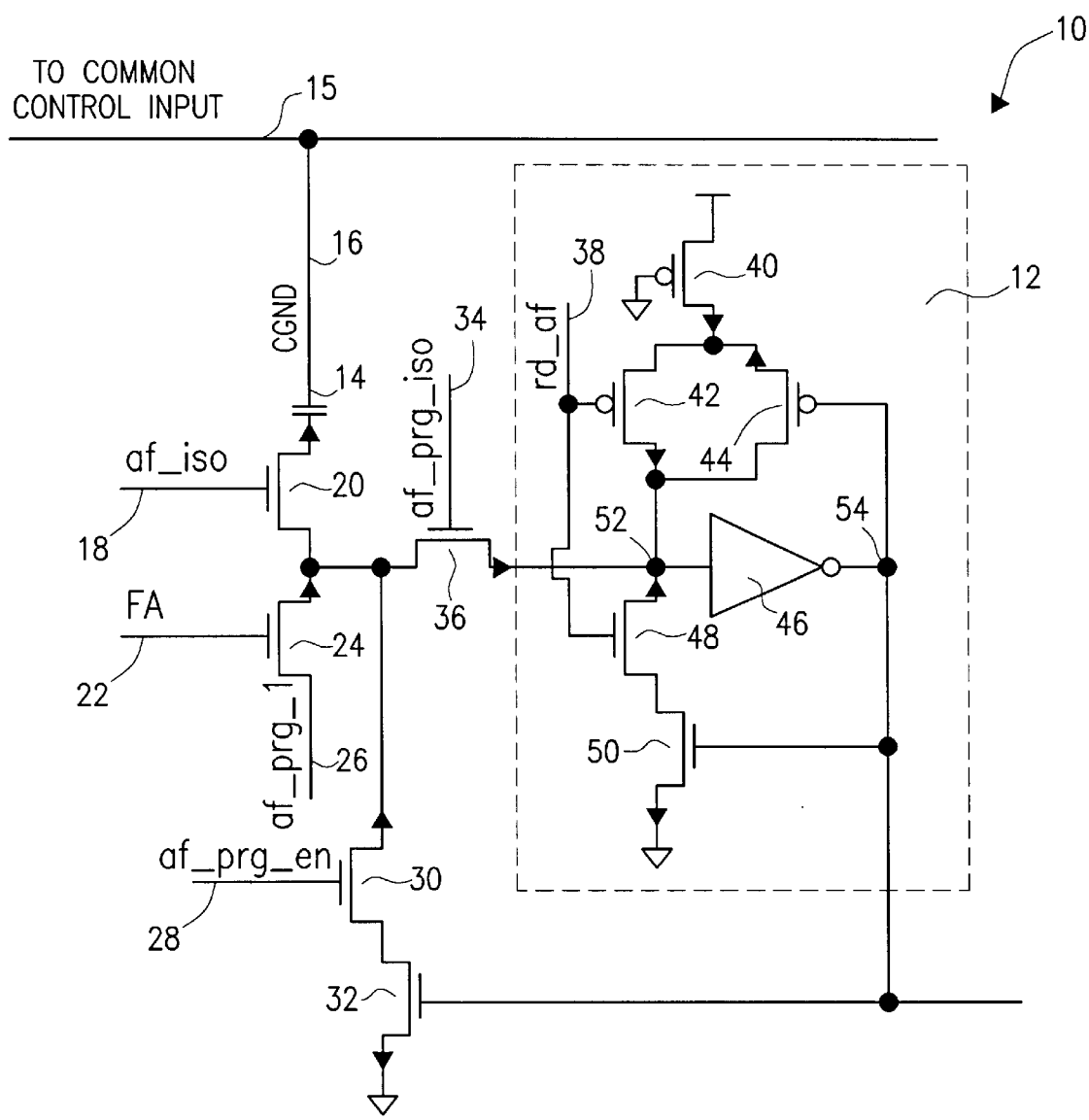
FIG. 1 illustrates a schematic diagram of a circuit including a programming circuit constructed in accordance with an exemplary embodiment of the invention.

FIG. 1 illustrates an exemplary embodiment of an anti-fuse programming circuit 10 constructed in accordance with the present invention. The anti-fuse programming circuit 10 includes an anti-fuse device 14 coupled between a CGND signal line 16 and a first source/drain of an anti-fuse isolation transistor 20. The CGND signal is typically a ground connection. The gate of the anti-fuse isolation transistor 20 is controlled by an anti-fuse isolation signal line 18. A second source/drain of the anti-fuse isolation transistor 20 is coupled to an input of an anti-fuse latch circuit 12 through a latch isolation transistor 36. The gate of the latch isolation transistor 36 is controlled by a latch isolation programming signal line 34. The second source/drain of the anti-fuse isolation transistor 20 is also coupled to a first source/drain of an state control transistor 32 through a programming enable transistor 30. The gate of the programming enable transistor 30 is controlled by an anti-fuse programming enable signal line 28. A second source/drain of the state control transistor 32 is coupled to a first reference voltage (e.g., ground), and the gate of the state control transistor 32 is controlled by an output of the anti-fuse latch circuit 12.

The input of the anti-fuse latch circuit 12 is coupled through the latch isolation transistor 36 to a junction of a first source/drain of a soft-programming transistor 24 and a source/drain of isolation transistor 20. The gate of the soft-programming transistor 24 is controlled by a first soft-programming signal FA on line 22, and a second source/drain of the soft-programming transistor 24 is coupled to a second soft-programming signal line 26.

As shown in FIG. 1, the anti-fuse latch circuit 12 includes an inverter circuit 46 having an input coupled to the input of the anti-fuse latch circuit 12 (at input node 52) and an output coupled to the output of the anti-fuse latch circuit 12 (at output node 54). A pair of p-channel transistors 42, 44 are connected in parallel between the inverter input 52 and a second reference voltage (e.g., Vcc) through a third p-channel transistor 40. The gate of a first p-channel transistor 42 is controlled by a read-and-latch signal line 38, and the gate of a second p-channel transistor 44 is controlled by the inverter output 54. The third p-channel transistor 40 has its gate coupled to the first reference voltage (e.g., ground). A pair of n-channel transistors 48, 50 are coupled in series between the inverter input 52 and the first reference voltage (e.g., ground). A first n-channel transistor 48 has a gate controlled by the read-and-latch signal line 38, and a second n-channel transistor 50 has a gate controlled by the inverter output 54. The inverter output 54 is coupled to the gate of the state control transistor 32. In an exemplary embodiment of the invention which is used in a memory device, the inverter output 54 is transmitted to one or more dynamic random access memory (DRAM) circuits which use anti-fuse programming data, for example, one or more circuits which substitute a redundant row or column of memory cells for a primary row or column which contains at least one defective memory cell.

In operation, the programming circuit 10 may be programmed by initially soft-programming the latch circuit 12 with the desired state of the anti-fuse device 14, and then using the output 54 of the latch circuit 12 to hard-program the anti-fuse device 14. The anti-fuse isolation signal line 18 is set "low" to de-activate the anti-fuse isolation transistor 20, and the latch isolation programming signal line 34 is set "high" to gate the latch isolation transistor 36. This couples the latch circuit 12 to the soft-programming transistor 24. Soft-programming is accomplished by applying a desired combination of first and second soft-programming signals to lines 22 and 26. For example, the first soft-programming signal line 22 may be set "high" to couple the second soft-programming signal line 26 to the input 52 of the latch circuit 12. The second soft-programming signal line 26 is set "low" to cause the input 52 of the latch circuit 12 to transition low, causing the inverter output 54 to transition "high." The "high" state of the inverter output is latched in the latch circuit 12 because the "high" output 54 tends to activate the gate of the second n-channel transistor 50, coupling the inverter input 52 to the first reference voltage (e.g., ground) through the first n-channel transistor 48, tending to pull the inverter input "low."

The anti-fuse isolation signal line 18 is set "high" to gate the anti-fuse isolation transistor 20, the latch isolation programming signal line 34 is set "low," and the anti-fuse programming enable signal line 28 is set "high" to gate the programming enable transistor 30. This couples the state control transistor 32 to the anti-fuse device 14. The latched state (output 54) of the latch circuit 12 is applied to the gate of the state control transistor 32, and a CGND programming pulse is applied on the CGND signal line 16. If the output 54 is "high," hard-programming is accomplished for the anti-fuse device 14. For example, if the latched state (output 54) indicates that the anti-fuse device 14 is desired to be blown, then the CGND programming pulse will apply a voltage sufficient to blow the anti-fuse device 14, causing the anti-fuse device 14 to short-circuit. For example, application of the voltage to the anti-fuse device 14 causes it to achieve a conducting state. An exemplary fuse blow voltage applied to the CGND signal line may be between approximately 8 and 9 volts.

Figures 2, 2A, 2B:
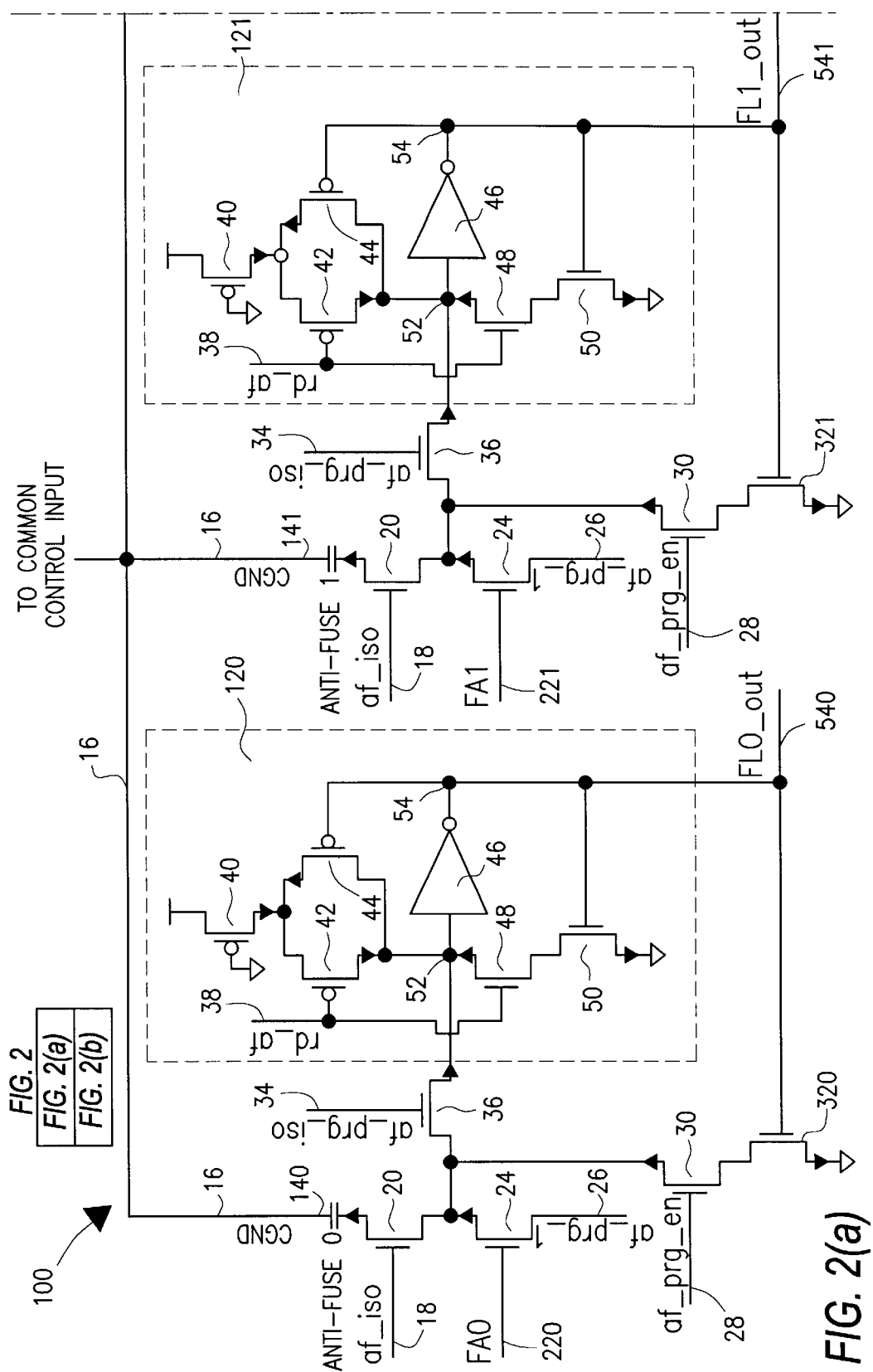
FIGS. 2A and 2B form a schematic diagram of a programming circuit with a plurality of programmable elements in accordance with another exemplary embodiment of the invention.
Figure 2B:
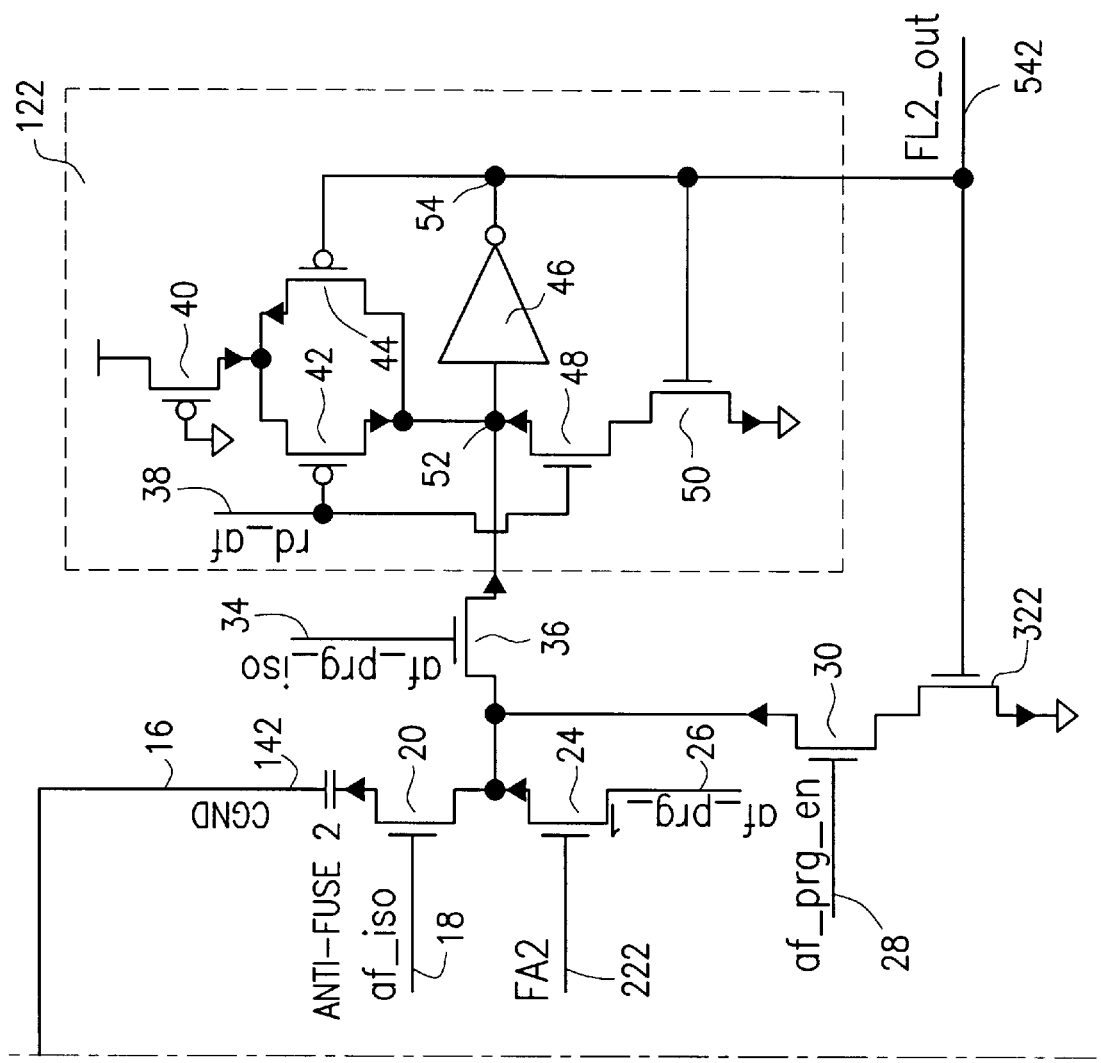

Referring to FIGS. 2A and 2B, a plurality of anti-fuse programming circuits 12 (FIG. 1) may be coupled together in a parallel anti-fuse programming circuit 100. For example, the exemplary parallel anti-fuse programming circuit 100 illustrated in FIGS. 2A and 2B includes three of the anti-fuse programming circuits 12 shown in FIG. 1. The three anti-fuse programming circuits 12 share a common CGND signal line 16, so that all three anti-fuse devices 140, 141, 142 may be programmed substantially simultaneously with a single CGND programming pulse. The common CGND signal line 16 may be coupled to a common control input signal line 15 for this purpose.

In operation, anti-fuse latch circuits 120, 121, 122 may each be individually soft-programmed using three separate first soft-programming signal lines FA0 (220), FA1 (221), and FA2 (222). The same second soft-programming signal line 26 can be used for each of the anti-fuse programming circuits 12 (FIG. 1), and the first soft-programming signal lines 220, 221, 222 thus control whether a respective anti-fuse 140, 141, 142 is to be blown.

Referring to FIG. 3, the operation of the exemplary embodiment of the invention shown in FIG. 2 is illustrated for an example in which anti-fuse devices 140 and 142 are desired to be blown, and anti-fuse device 141 is not desired to be blown. FIG. 3 shows timing diagrams for the signals shown in FIG. 2. At time t1, the anti-fuse isolation signal line 18 transitions low turning off transistor 24 to de-couple each of the anti-fuse devices 140, 141, 142 from the remainder of the anti-fuse programming circuits, including the anti-fuse latch circuits 120, 121, 122. Also at t1, the latch isolation signal line 34 transitions from low to high to turn on isolation transistor 36 and permit soft-programming of each of the anti-fuse latch circuits 120, 121, 122.

At t2, initialization of the anti-fuse latch circuits 12 begins via transition of the read-and-latch signal line 38 from high to low, causing the second reference voltage (e.g., Vcc) to be applied to the inverter input 52 through the first p-channel transistor 42. Each read-and-latch signal line 38 transitions low at time t2 to gate the first p-channel transistors 42. Thus gated, the first p-channel transistor 42 permits the second reference voltage to be coupled to the inverter input 52. This tends to pull the inverter output low, which tends to turn on the second p-channel transistor 44, setting the default value of the latch (e.g., programming element NOT to be blown) in preparation for receipt of the soft-programming signal at t3.

At t3, the first soft-programming signal lines 220, 221, 222 are set to the desired state for their respective anti-fuses devices 140, 141, 142. For example, anti-fuse devices 140 and 142 are desired to be blown, so the first soft-programming signal lines 220, and 222 are set high at t3, thereby coupling a second soft-programming signal line 26 to the input of the anti-fuse latch circuits 120 and 122. The second soft-programming signal line 26 is set low so as to cause the input 52 of coupled latch circuits 120 and 122 to transition low, thus causing the latch output 54 to transition high. In contrast, anti-fuse device 141 is not desired to be blown, so the first soft-programming signal line 221 is set (or remains) low at t3, thereby not applying the second soft-programming signal 26 to the input of the anti-fuse latch circuit 121. The outputs 540, 541, 542 of the anti-fuse latch circuits 12, which are fed back to control the state control transistors 32, reflect the settings of the first soft-programming signal lines 220, 221, 222.

At time t4, initialization of the anti-fuse latch circuits 120, 121, 122 ends, and the read-and-latch signal line 38 transitions low to high causing the anti-fuse latch circuits 120, 121, 122 to latch the desired soft-programming state, which is determined by the state of first soft-programming signal lines 220, 221, 222 for each anti-fuse programming circuit. Latching occurs because the inverter output 54 is coupled to the second p- and n-channel transistors 44 and 50, respectively. If the inverter output 54 is low, signaling that the anti-fuse device (e.g., 141) is not to be blown, the p-channel transistor 44 is gated by the low inverter output 54 and thereby couples the second reference voltage (e.g., Vcc) to the inverter input 52, holding the latch output (e.g., 541) low. Conversely, if the inverter output 54 is high, signaling that the anti-fuse device (e.g., 140, 142) is to be blown, the second n-channel transistor 50 is gated by the high inverter output 54 and thereby couples the first reference voltage (e.g., ground) to the inverter input 54 through the first n-channel transistor 48 (which is gated when the read-and-latch signal line 38 transitions from low to high at time t4), holding the latch input 52 low and thus the latch output (e.g., 540, 542) high.

At time t5, the first soft-programming signals 220, 221, 222 are reset low, but the latched soft-programming states continue to be reflected in the inverter outputs 540, 541, 542, due to the latches 120, 121, 122 holding the soft-programmed states.

At time t6, the anti-fuse isolation signal line 18 transitions from low to high, and the latch isolation signal line 34 transitions from high to low, thus turning on the anti-fuse isolation transistor 20 and turning off the latch isolation transistor 36. This couples the anti-fuse devices 140, 141, 142 to the programming enable transistors 30 and decouples the anti-fuse latch circuits 120, 121, 122 from the programming enable transistors 30. The programming enable signal line 28 transitions from low to high to couple the anti-fuse devices 140, 141, 142 to the state control transistors 32.

At time t7, an anti-fuse blow voltage is applied to the CGND signal line 16. For anti-fuse devices 140, 142, the voltage on CGND signal line 16 is coupled to the first reference voltage (e.g., ground) through the anti-fuse devices 140, 142 because the anti-fuse isolation transistors 18, the programming enable transistors 30, and the state control transistors 320, 322 (due to gate controlling latch outputs 540, 542) are all turned on at time t7. This applies the blow voltage on the CGND signal line 16 (e.g., approximately 8–9 volts) to the anti-fuse devices 140 and 142, causing them to be blown. Likewise, for anti-fuse device 141, the CGND signal line 16 is not coupled to the first reference voltage (e.g., ground) through the anti-fuse device 141, because the state control transistor 321 (due to gate controlling latch output 541) is turned off at time t7. Thus anti-fuse 141 is not blown.

Figure 4:
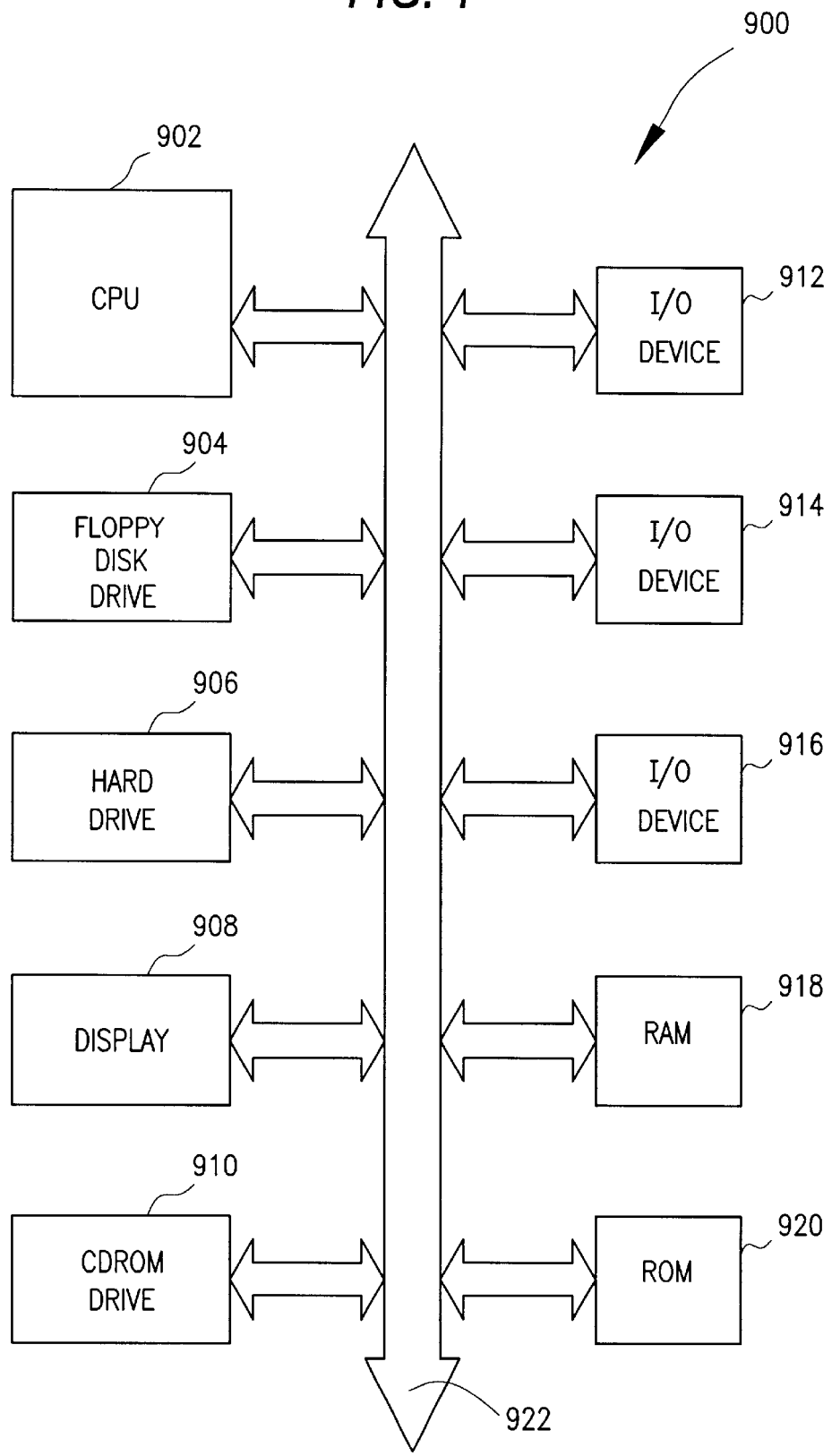
FIG. 4 illustrates a processor system formed in accordance with another exemplary embodiment of the invention.

FIG. 4 illustrates an exemplary processor system 200 which may include a parallel anti-fuse programming circuit 100 in accordance with the invention. Referring to FIG. 4, the processor system 900, which may be a computer system, for example, generally comprises a central processing unit (CPU) 902, for example, a microprocessor, that communicates with one or more input/output (I/O) devices 912, 914, 916 over a system bus 922. The computer system 900 also includes random access memory (RAM) 918, a read only memory (ROM) 920 and, in the case of a computer system may include peripheral devices such as a floppy disk drive 904, a hard drive 906, a display 908 and a compact disk (CD) ROM drive 910 which also communicate with the processor 902 over the bus 922. The RAM 918 includes memory devices having at least one parallel anti-fuse programming circuit 100 constructed in accordance with the invention which is used to program some aspect of the RAM 918, for example one or more redundant rows or columns of memory cells for use in place of defective primary rows or columns containing a defective cell. In addition, one or more of the other elements shown in FIG. 4 may also include at least one integrated circuit including an anti-fuse programming circuit 10 constructed in accordance with the invention. It should also be noted that FIG. 4 is merely representative of many different types of processor system architectures which may employ the invention, and that the central processing unit 902 and RAM 918 may be combined on a single integrated circuit chip.

An anti-fuse programming circuit 10 has been described that improves performance of integrated circuits by permitting a plurality of anti-fuse devices 14 to be programmed substantially simultaneously. These and other advantages are achieved by constructing a parallel anti-fuse programming circuit 100 including a plurality of anti-fuse programming circuits, each including a respective anti-fuse latch circuit 120, 121, 122, that share a common CGND programming signal line. This arrangement permits a plurality of anti-fuse latch circuits 12 to be soft-programmed, and a single CGND programming pulse to be used to hard-program a plurality of anti-fuse devices 140, 141, 142 at the same time.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A programming circuit for a plurality of programmable elements, said programming circuit comprising:

a plurality of programmable elements;

a plurality of element programming circuits each associated with a programmable element and each including a latch circuit for receiving and holding a desired programming state of an associated programmable element, said plurality of element programming circuits setting the state of said associated programmable elements in accordance with a desired programming state held in an associated latch in response to a common control signal; and a latch programming circuit for temporarily applying a programming signal to an input of a respective latch circuit, said latch circuit latching a state of said programming signal, said latch programming circuit comprising,
   a latch isolation transistor coupled between said programmable element and said latch circuit, and
   a latch-programming transistor having a gate controlled by a first latch-programming signal, a first source/drain coupled to a second latch-programming signal, and a second source/drain coupled to said input of said latch circuit through said latch isolation transistor.

2. A circuit as in claim 1, wherein each said latch circuit comprises:
   an inverter circuit having an input coupled to an input of said latch circuit and an output coupled to an output of said latch circuit;
   a pair of n-channel transistors connected in series between an input of said latch circuit and a first reference voltage;
   a pair of p-channel transistors connected in parallel between said input of said latch circuit and a second reference voltage;
   a read-and-latch signal line coupled to control gates of a first of said pair of p-channel transistors and a first of said pair of n-channel transistors;
   wherein said output of said inverter circuit is coupled to control gates of a second of said pair of p-channel transistors and a second of said pair of n-channel transistors.

3. A circuit as in claim 2, wherein said read-and-latch signal line is configured to apply a read-and-latch signal to permit reading and latching of said desired programming signal.

4. A circuit as in claim 2, wherein a third p-channel transistor is coupled between said pair of parallel-connected p-channel transistors and said second reference voltage, said third p-channel transistor having a gate coupled to said first reference voltage.

5. A circuit as in claim 1, wherein said common control signal includes a voltage of between approximately 8 and 9 volts.

6. A circuit as in claim 1, wherein said common control signal includes a voltage sufficient to change a state of said associated programmable elements.

7. A programming circuit for a programmable element, comprising:
   at least one latch circuit;
   at least one latch-programming circuit for temporarily applying a programming signal to an input of a respective latch circuit, said latch circuit latching a state of said programming signal;
   a signal line applying a voltage sufficient to change the state of said programmable element;
   at least one latch isolation transistor coupled between said programmable element and said latch circuit;
   at least one state control transistor coupled between said programmable element and a first reference voltage and having a gate controlled by an output of said latch circuit;

wherein said at least one latch-programming circuit further comprises, at least one latch-programming transistor having a gate controlled by a first latch-programming signal, a first source/drain coupled to a second latch-programming signal, and a second source/drain coupled to said input of said latch circuit through one of said at least one latch isolation transistor, and wherein during a programming phase, said latch circuit is configured to latch said programming signal, and during a common control phase, said latch isolation transistor is configured to decouple said programmable element from said latch circuit and said signal line is configured to apply said state-changing voltage to said programmable element if said output of said latch circuit turns on said state control transistor.

8. A circuit as in claim 7, wherein said at least one latch circuit comprises:
   an inverter circuit having an input coupled to said input of said latch circuit and an output coupled to said output of said latch circuit;
   a pair of n-channel transistors connected in series between an input of said latch circuit and said first reference voltage;
   a pair of p-channel transistors connected in parallel between said input of said latch circuit and a second reference voltage;
   a read-and-latch signal line coupled to control gates of a first of said pair of p-channel transistors and a first of said pair of n-channel transistors;
   wherein said output of said inverter circuit is coupled to control gates of a second of said pair of p-channel transistors and a second of said pair of n-channel transistors.

9. A circuit as in claim 8, wherein said read-and-latch signal line is configured to apply a read-and-latch signal during said programming phase to permit reading and latching of said programming signal.

10. A circuit as in claim 8, wherein a third p-channel transistor is coupled between said pair of parallel-connected p-channel transistors and said second reference voltage, said third p-channel transistor having a gate coupled to said first reference voltage.

11. A circuit as in claim 7, further comprising at least one programming enable transistor configured to couple said state control transistor to said programmable element during said common control phase.

12. A circuit as in claim 7, further comprising at least one programmable element isolation transistor configured to decouple said programmable element from said latch circuit and said latch-programming circuit during said programming phase.

13. A circuit as in claim 7, wherein said state-changing voltage includes a voltage sufficient to blow an anti-fuse.

14. A circuit as in claim 7, wherein during said common control phase, said state-changing voltage of between approximately 8 and 9 volts is applied to said signal line.

15. A memory circuit, comprising:
   a plurality of memory elements; and
   at least one programming circuit associated with a plurality of programmable elements and configured to activate one or more of said plurality of memory elements, said programming circuit comprising:
   a plurality of programmable elements;
   a plurality of element programming circuits each associated with a programmable element and each including a latch circuit for receiving and holding a desired programming state of an associated programmable element, said plurality of element programming circuits setting the state of said associated programmable elements in accordance with a desired programming state held in an associated latch in response to a common control signal; and a latch programming circuit for temporarily applying a programming signal to an input of a respective latch circuit, said latch circuit latching a state of said programming signal, said latch programming circuit comprising, a latch isolation transistor coupled between said programmable element and said latch circuit, and a latch-programming transistor having a gate controlled by a first latch-programming signal, a first source/drain coupled to a second latch-programming signal, and a second source/drain coupled to said input of said latch circuit through said latch isolation transistor.

16. A memory circuit as in claim 15, wherein said common control signal includes a voltage of between approximately 8 and 9 volts.

17. A memory circuit as in claim 16, wherein each said latch circuit comprises:

an inverter circuit having an input coupled to an input of said latch circuit and an output coupled to an output of said latch circuit;

a pair of n-channel transistors connected in series between an input of said latch circuit and a first reference voltage;

a pair of p-channel transistors connected in parallel between said input of said latch circuit and a second reference voltage;

a read-and-latch signal line coupled to control gates of a first of said pair of p-channel transistors and a first of said pair of n-channel transistors;

wherein said output of said inverter circuit is coupled to control gates of a second of said pair of p-channel transistors and a second of said pair of n-channel transistors.

18. A memory circuit as in claim 17, wherein said read-and-latch signal line is configured to apply a read-and-latch signal to permit reading and latching of said desired programming signal.

19. A memory circuit as in claim 17, wherein a third p-channel transistor is coupled between said pair of parallel-connected p-channel transistors and said second reference voltage, said third p-channel transistor having a gate coupled to said first reference voltage.

20. A memory circuit, comprising:

a plurality of memory elements; and at least one programming circuit associated with a plurality of programmable elements and configured to activate one or more of said plurality of memory elements, said programming circuit comprising:

at least one latch circuit;

at least one latch-programming circuit for temporarily applying a programming signal to an input of a respective latch circuit, said latch circuit latching a state of said programming signal;

a signal line applying a voltage sufficient to change the state of said programmable element;

at least one latch isolation transistor coupled between said programmable element and said latch circuit;

at least one state control transistor coupled between said programmable element and a first reference voltage and having a gate controlled by an output of said latch circuit;

wherein said latch-programming circuit comprises at least one latch-programming transistor having a gate controlled by a first latch-programming signal, a first source/drain coupled to a second latch-programming signal, and a second source/drain coupled to said input of said latch circuit through one of said at least one latch isolation transistor;

wherein during a programming phase, said latch circuit is configured to latch said programming signal, and during a common control phase, said latch isolation transistor is configured to decouple said programmable element from said latch circuit and said signal line is configured to apply said state-changing voltage to said programmable element if said output of said latch circuit turns on said state control transistor.

21. A memory circuit as in claim 20, wherein during said common control phase, said state-changing voltage of between approximately 8 and 9 volts is applied to said signal line.

22. A memory circuit as in claim 20, wherein said at least one latch circuit comprises:

an inverter circuit having an input coupled to said input of said latch circuit and an output coupled to said output of said latch circuit;

a pair of n-channel transistors connected in series between an input of said latch circuit and said first reference voltage;

a pair of p-channel transistors connected in parallel between said input of said latch circuit and a second reference voltage;

a read-and-latch signal line coupled to control gates of a first of said pair of p-channel transistors and a first of said pair of n-channel transistors;

wherein said output of said inverter circuit is coupled to control gates of a second of said pair of p-channel transistors and a second of said pair of n-channel transistors.

23. A memory circuit as in claim 22, wherein said read-and-latch signal line is configured to apply a read-and-latch signal during said programming phase to permit reading and latching of said programming signal.

24. A memory circuit as in claim 22, wherein a third p-channel transistor is coupled between said pair of parallel-connected p-channel transistors and said second reference voltage, said third p-channel transistor having a gate coupled to said first reference voltage.

25. A memory circuit as in claim 20, further comprising at least one programming enable transistor configured to couple said state control transistor to said programmable element during said common control phase.

26. A memory circuit as in claim 20, further comprising at least one programmable element isolation transistor configured to decouple said programmable element from said latch circuit and said latch-programming circuit during said programming phase.

* * * * *